United States Patent [19]

Goforth

[11] Patent Number: 4,958,590

[45] Date of Patent: Sep. 25, 1990

[54] MICROWAVE TRAVELING-WAVE DIAMOND PRODUCTION DEVICE AND METHOD

[75] Inventor: Robert R. Goforth, Encinitas, Calif.

[73] Assignee: General Atomics, San Diego, Calif.

[21] Appl. No.: 403,335

[22] Filed: Sep. 6, 1989

[51] Int. Cl.$^5$ ............................................. C23C 16/50
[52] U.S. Cl. ..................................... 118/723; 423/446
[58] Field of Search .......................... 118/723; 423/446

[56] References Cited

U.S. PATENT DOCUMENTS

| | | | |
|---|---|---|---|
| 4,434,188 | 2/1984 | Kamo et al. | 427/39 |
| 4,707,384 | 11/1987 | Schachner et al. | 427/249 |
| 4,728,529 | 3/1988 | Etzkorn et al. | 427/39 |

OTHER PUBLICATIONS

Kamo et al., "Diamond Synthesis from Gas Phase in Microwave Plasma," Journal of Crystal Growth, vol. 62, 1983, pp. 642-644.
Matsumoto et al., "Chemical Vapor Deposition of Diamond in RF Glow Discharge," Journal of Materials Science Letters, vol. 4, 1985, pp. 600-602.
Matsumoto et al., "Synthesis of Diamond Films in a RF Induction Thermal Plasma," Applied Physics Letters, vol. 51, No. 10, Sep. 7, 1987, pp. 737-739.
Hirose et al., "Synthesis of Diamond Thin Films by Thermal CVD Using Organic Compounds," Japanese Journal of Applied Physics, vol. 25, No. 6, Jun. 1986, pp. L519-L521.
Spear, "Growth of Crystalline Diamond from Low-Pressure Gases," Earth and Mineral Sciences, vol. 56, No. 4, Summer 1987, pp. 53-59.
"Scientists Discover Diamond-Film Coating Process," New York Times News Service, prior to Sep. 18, 1986.
"Specification Sheet for Fringing Field Applicator, Model GL510," Gerling Laboratories Catalog, p. 7, prior to 1987.
"Specification Sheet for Bend with Product Tube, Models GL506, GL507," Gerling Laboratories Catalog, p. 12, prior to 1987.
Electronics Designers' Handbook, Second Edition, pp. 8-36, 8-37, (McGraw Hill, 1977).

*Primary Examiner*—Richard Bueker
*Attorney, Agent, or Firm*—Fitch, Even, Tabin & Flannery

[57] ABSTRACT

A microwave traveling-wave production element produces diamond using a chemical vapor deposition (CVD) process. The production element includes a waveguide of a specified length and cross section designed to operate in a specified microwave transmission mode. A microwave oscillator mounted at one end of the waveguide provides microwave energy to the waveguide at a specified frequency for operating in the desired transmission mode. A matched termination load mounted at the other end of the waveguide absorbs the microwave energy that travels through the waveguide and prevents standing waves from being developed within the waveguide. One or more substrate plates are positioned within the waveguide so as to follow a contour of approximately constant tranverse electric field strength. A gaseous mixture, having a composition that promotes the deposition of diamond on the substrate plates, is maintained proximate the substrate plates at a specified pressure. The energy of the microwaves traveling through the waveguide creates plasma having a uniform temperature near the region of the substrate plates and further heats the gaseous mixture and substrate plates sufficiently to promote the CVD deposition of diamond on the surface of the substrate plates. Several production elements may be combined in a production system to significantly increase the number of substrate plates used, and hence the yield of the diamond.

22 Claims, 6 Drawing Sheets

MICROWAVE TRAVELING-WAVE DIAMOND PRODUCTION DEVICE AND METHOD

FIELD OF THE INVENTION

The present invention relates to apparatus and methods for producing diamond using chemical vapor deposition techniques, and more particularly to apparatus and methods for depositing diamond on a fixed substrate in a plasma, the substrate and plasma being located in a reaction tube that is positioned within a traveling-wave microwave device.

BACKGROUND OF THE INVENTION

During the past decade, considerable work has been done on producing diamond by chemical vapor deposition (CVD) processes. Kamo et al., "Diamond Synthesis From Gas Phase in Microwave Plasma," Journal of Crystal Growth 62, pp. 642-644 (1983); and Spear, "Growth of Crystalline Diamond from Low-Pressure Gases," Earth and Mineral Sciences, Vol. 56, No. 4 pp. 53-59 (Summer 1987) are representative of such work. Further, U.S. Pat. No. 4,707,384 (Schachner et al.) lists additional references to the substantial work of different parties which has been performed in this general area.

The Kamo et al. and Spear references, cited above, as well as U.S. Pat. No. 4,434,188 (Kamo et al.), disclose the use of microwave energy to create plasma for such a CVD diamond-forming method. (Plasma is ionized gas.)

Although the ground work has been done to show the feasibility of producing diamond by such a CVD process, much remains to be done to improve the economics of the process for commercialization. One of the ways to improve the economic practicabilities of the CVD process is to improve the yield of the process, that is, the total mass of diamond produced from a given quantity of raw materials and power. It is known that the largest diamond growth rates are obtained using plasma deposition methods. In accordance with these methods, a gas mixture containing carbon, hydrogen, and oxygen atoms is partially ionized to create a plasma. In ionizing the gas mixture, some of the carbon atoms produced by the ionization process dissociate from the gas molecules to form diamond crystals on a substrate such as molybdenum or silicon that is near or in the plasma and at a temperature of about 900° C. to 1000° C. Diamond consists of only carbon atoms arranged in a particular tetragonal crystalline structure. As the diamond crystals grow or spread, they become a diamond film. In order to achieve the best yield, and to keep power consumption to a minimum, the hydrogen and carbon atoms produced must be used efficiently to create the diamond. Any regions of the substrate that are outside of the allowable temperature range reduce the efficiency because incident carbon atoms in such regions may form other carbon structures, such as graphite, or combine with other atoms, e.g., hydrogen or oxygen atoms, to produce other molecules rather than a diamond structure. Hence, the energy supplied to dissociate the carbon atoms is wasted, and the yield of the diamond production process correspondingly decreases. What is needed, therefore, is a diamond production process and/or device wherein the relative number of dissociated carbon atoms deposited as diamond is increased.

Further, as is known in the art, the hydrogen atoms present in the partially ionized gas are needed to prevent the formation of graphite on the substrate surface and/or to scavenge any graphite that is formed. Graphite, like diamond, consists only of carbon atoms, but the atoms are arranged in layers with hexagonal symmetry. Such ionized hydrogen atoms disadvantageously recombine on a cold substrate to form hydrogen molecules, thereby losing their effectiveness at inhibiting the formation of graphite, and further wasting their dissociation energy.

Unfortunately, in prior art processes and apparatus, it has been difficult to maintain a uniform substrate temperature because of variations in the plasma temperature and/or distribution near the substrate surface. Plasma temperature variations may produce hot and cold spots on the substrate, reducing the yield of the process for the reasons ascribed above. Plasma distribution variations may likewise reduce the overall efficiency of the production system because the plasma conditions are not optimized for the greatest diamond production, i.e., the needed ionized atoms are not everywhere present at each position on the substrate. Thus, what is needed to improve the yield of the system is a mechanism for producing a uniform plasma, both in terms of temperature and distribution, along the entire length of the substrate on which diamond is deposited.

Unfortunately, producing and maintaining a reasonably uniform plasma over the entire surface area of a substrate at the gas pressures of 4 torr to 10 torr needed for the diamond CVD process is difficult to achieve. For example, in the case of microwave creation of the plasma at a frequency of 2.45 GHz, difficulties arise because the absorption depth for the microwave radiation in the plasma is at most a few centimeters. Such a shallow absorption depth makes maintaining a constant temperature a formidable task. Moreover, if microwave reflections occur, standing waves are set up that have deep minima or nulls spaced one-half wavelength apart. At each of these minima or nulls the plasma is not heated by the microwave energy to the same degree as it is at other locations. Thus, these nulls can significantly limit the effective length of the substrate that can be used for the deposition process. For example, the free-space wavelength at 2.45 GHz is 12.2 cm, yet guide wavelengths of perhaps a few times this length can be achieved in a practical system. However, because of the maxima and minima associated with a standing wave, only some of this overall length could contribute to the production of diamond.

From the above considerations, it is apparent that what is needed to grow diamond crystal or diamond film efficiently with a high yield is a large substrate area over which a uniform plasma is maintained. The degree of uniformity required is such that the substrate temperature remain within the allowable range over the plasma-covered area and that the plasma conditions remain at or close to optimum over this same area. With such a uniform plasma distribution, a uniform nucleation density and growth rate of the diamond crystals or film over the entire substrate area would result.

SUMMARY OF THE INVENTION

The present invention advantageously provides a microwave traveling-wave production element that generates and maintains a uniform plasma over a large substrate area, thereby significantly improving the yield associated with the diamond CVD process. The production element includes a waveguide having a straight waveguide section of a specified length and uniform cross section designed to operate in a specified microwave transmission mode. For example, the waveguide may be a rectangular waveguide designed to operate in the $TE_{10}$ or $TE_{20}$ transmission mode. The production element further includes a source of microwave energy mounted at one end of the waveguide. A matched termination load is mounted at the other end of the waveguide. Microwave energy from the source travels through the waveguide. Energy not absorbed in passing through the waveguide is absorbed in the matched load. No significant reflections of the microwave energy occur, and hence standing waves are not developed within the waveguide. One or more substrate plates, preferably two substrate plates, are mounted in a sealed reaction tube in which a gaseous mixture, having a composition that promotes the deposition of diamond on the substrate plate(s), is maintained at a specified pressure. The reaction tube, in turn, is carefully positioned within the waveguide so as to follow a contour line of approximately constant transverse electric field strength when the waveguide is excited with the specified microwave energy, in the specified mode. Advantageously, the energy of the traveling microwaves within the waveguide creates a uniform plasma and maintains it in the region near the substrate plate(s). In turn, the plasma, in concert with the microwave energy, heats the gaseous mixture and substrate plate(s) sufficiently to promote the deposition of diamond along the entire surface area of the substrate plate(s). The sealed reaction tube may be openable at one end, thereby allowing the substrate plate(s) to be readily inserted and removed.

In accordance with the present invention, energy is added to the gas mixture uniformly by disposing the reaction tube at an angle to the waveguide. More particularly, the absorption of energy from the propagating microwave reduces the transverse electric field strength of the microwave. This would cause the energy absorption to decrease in the direction of propagation of the microwave but for the angling of the tube. The microwave propagation in the specified mode, a $TE_{mn}$ mode, results in a distribution of power across the cross section of the waveguide. The tube is disposed obliquely of the longitudinal axis of the waveguide section to keep the tube in a region of substantially constant energy absorption along the length of the waveguide section. In this manner energy is added to the gas mixture uniformly along the tube, providing uniform ionization and uniform heating, assuring uniform deposition of diamond. The tube is also preferably straight and of uniform cross section, as are the substrate plates. The reaction tube is preferably circularly cylindrical with its central axis at an angle to the axis of the waveguide section at which the tube is in a region of substantially constant transverse electric field strength over the desired region of disposition along the substrate plates.

The present invention further combines several such production elements, e.g., 50 such elements, in a single production device in order to increase the mass of diamond that can be produced in a given time. Each production element within the production device shares a common source of gaseous mixture and means for generating the specified pressures needed for the process. Other support systems, such as a cooling system, may also be shared in common among the elements included in the device. Advantageously, the elements in such a production device are all mounted substantially parallel to each other and oriented so that the openable end of each reaction tube is accessible from a single plane, thereby facilitating the insertion and removal of the substrate plates.

In one embodiment of the invention, a diamond production element is provided that comprises: (1) a waveguide through which microwave energy may be transmitted according to a prescribed mode of transmission; (2) a substrate plate installed within the waveguide so that it approximately parallels a constant electric field contour line of the waveguide when the waveguide is operated in the prescribed mode of transmission; (3) a supply of a gaseous mixture at a specified pressure to that portion of the waveguide proximate the substrate plate, the gaseous mixture having a composition that promotes the deposition of diamond on the plate when the gaseous mixture is ionized and maintained at approximately the specified pressure and when the gaseous mixture and the plate are elevated to within a prescribed temperature range; and (4) a microwave plasma generator proximate the plate, the microwave plasma generator including a microwave source for energizing the waveguide with microwave energy that travels through the waveguide according to the prescribed mode of transmission, the microwave energy ionizing the gaseous mixture as it travels through the waveguide, thereby creating the plasma, and the traveling microwave energy further heating the gaseous mixture and the substrate plate to the prescribed temperature range, whereby the deposition of diamond along the surface area of the plate is promoted.

In another embodiment, the production element of the present invention includes a waveguide structure having microwave energy applied to a first end thereof. This microwave energy causes a transverse electric field to be present within the waveguide structure that, according to well established microwave transmission principles, has a magnitude that varies within a given cross section of the waveguide structure from zero at the edges to at least one peak value intermediate the edges. Further, the magnitude of the electric field decreases in amplitude as the distance from the first end of the waveguide structure increases. A reaction tube, wherein diamond is deposited, is inserted inside of the waveguide structure. This reaction tube includes a sealed tubular body, at least one substrate plate passing longitudinally through the tubular body, and a gaseous mixture in the tubular body at a prescribed pressure. The gaseous mixture has a composition that promotes the deposition of diamond over the substrate when the substrate and gaseous mixture are elevated to a specified temperature range, and when a plasma is present in the region near the substrate. Advantageously, the plasma is created from the gaseous mixture by the application of the microwave energy to the waveguide structure, and the elevated temperature is also attained and maintained by the microwave energy. In order to promote a uniform plasma within the reaction tube, the reaction tube is carefully positioned within the waveguide structure so as to coincide approximately with a contour of substantially constant electric field strength. That is, near the first end of the waveguide structure the reaction tube is positioned at a point in the cross-sectional profile of the transverse electric field where the field is intermediate its minimum and maximum values. The other end of the reaction tube, being located near the end of the waveguide structure where the magnitude of the electric field has decreased, is positioned at a point in the cross-sectional profile of the transverse electric field where the field is nearer its maximum value.

A production device made in accordance with the present invention includes a plurality of diamond production elements, each being as described above, and each further having access for allowing the substrate plates to be removably inserted into the reaction tube. The device further includes mounting structure for mounting the plurality of diamond production elements in an orderly array, and that further positions the end of each production element having the access substantially in a plane that is perpendicular to the longitudinal axis of each reaction tube. This arrangement facilitates access to all the substrate plates through access to this plane. Further, coupled to this mounting structure is a delivery mechanism for allowing the gaseous mixture to be delivered to each of the production elements at the specified pressure from a common source of the pressurized gaseous mixture.

The invention further includes a method for depositing diamond over the surface area of an elongated substrate plate. This method includes the steps of: (1) providing a waveguide through which microwave energy may be transmitted according to a prescribed mode of transmission; (2) installing the substrate plate within the waveguide so that it approximately parallels a constant electric field contour of the waveguide when the waveguide is operated in the prescribed mode of transmission; (3) supplying a gaseous mixture at a specified pressure to that portion of the waveguide proximate the substrate plate, this gaseous mixture having a composition that promotes the deposition of diamond on the plate when the gaseous mixture is maintained at the specified pressure and when the gaseous mixture and the plate are elevated to a prescribed temperature in the presence of a plasma; and (4) energizing the waveguide with microwave energy that travels through the waveguide according to the prescribed mode of transmission, the microwave energy ionizing the gaseous mixture as it travels through the waveguide, thereby creating the plasma, and further heating the gaseous mixture and the plate to the prescribed temperature, thereby promoting the deposition of diamond film along the entire surface area of the substrate plate.

It is a feature of the present invention to provide a CVD diamond production element wherein microwave energy is used to create a substantially uniform plasma throughout the deposition region of the device.

It is a further feature of the invention to provide such a microwave production element wherein the substrate surface area, on which the diamond crystals or film are deposited, is exposed to a transverse electric field from the microwave energy that is approximately constant over entire area of the substrate surface.

It is another feature of the invention to provide such a microwave production element wherein the microwave energy travels longitudinally through the device without substantial reflections, thereby avoiding standing waves.

BRIEF DESCRIPTION OF THE DRAWINGS

The above and other advantages and features of the present invention will be more apparent from the following more particular description thereof, presented in conjunction with the following drawings, wherein.

DETAILED DESCRIPTION

The following description is of the best presently contemplated mode of practicing the invention. This description is not to be taken in a limiting sense but is made merely for the purpose of describing the general principles of the invention.

Figure 1A:
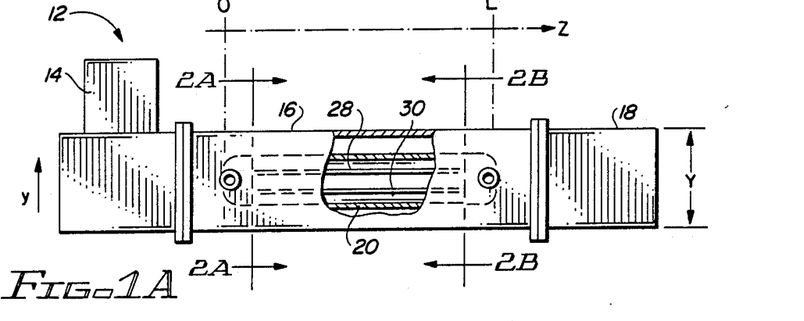
FIG. 1A is a side view of one embodiment of a diamond production element, with a portion of a waveguide wall cut away to show a reaction tube therein.
Figure 1B:
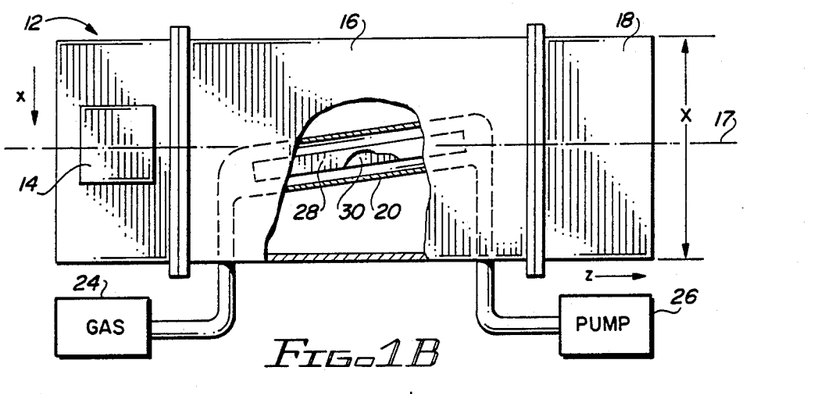
FIG. 1B is a top view of the element of FIG. 1A, further showing the manner in which gas is supplied to the reaction tube.

FIGS. 1A and 1B show side and top views of one embodiment of a diamond production element 12 in accordance with the present invention. The production element includes a microwave source 14, a waveguide section 16, and a matched load termination 18. In this embodiment, the waveguide section 16 is a rectangular waveguide, having a longitudinal axis 17 parallel to the z-direction of the x-y-z coordinate system shown. The waveguide further has a height Y and a width X. This rectangular cross section is seen best in the crosssectional views shown in FIGS. 2A and 2B discussed below. (It is to be understood that other types of waveguides could also be used, such as a circular waveguide.) The microwave source 14, when energized, causes a microwave energy to propagate through the element in the z direction from the source 14 to the termination 18. The matched load termination 18 assures that there are no reflections of this energy back through the waveguide 16 from the load 18 to the source 14, which reflections would undesirably set up standing waves.

A reaction tube 20 is mounted within the waveguide section 16 and contains substrate plates extending parallel to one another in the longitudinal direction of the tube 20. This reaction tube has a length L, measured in the z-direction, where L is only slightly less than the overall length of the waveguide section 16. The reaction tube 20 is angled relative to the longitudinal axis 17 of the waveguide section 16, as seen best in FIG. 1B. The significance of this orientation is discussed below in connection with FIGS. 2A-2C.

A prescribed gaseous mixture from a suitable source 24 is passed through the reaction tube 20 at a specified pressure provided by a vacuum pump 26. The gas which is used for generation of the plasma should include a carbon source, preferably a hydrocarbon, and a major portion of hydrogen, and it may also include oxygen and/or an inert or noble gas, such as argon. Preferably hydrogen constitutes the major portion of the gaseous mixture, and the hydrogen can be supplied either as hydrogen gas or as a hydrocarbon, such as methane or acetylene or a combination of both. The hydrocarbon serves as the carbon source and also supplies part of the hydrogen. It is further found that good results are obtained when the gaseous mixture contains between about $\frac{1}{2}\%$ and about 2%, by volume, of oxygen. Although oxygen gas can be supplied for this purpose, the optional oxygen content can also be supplied by using an organic alcohol, aldehyde or ketone which upon decomposition provides oxygen, hydrogen and carbon to the plasma. As indicated, the individual components of the gaseous mixture are supplied at the desired ratios so as to create the desired relative volume percents of the elements in the ultimate atmosphere, and the vacuum pump 26 is operated to maintain the pressure within the reaction chamber 20 at about 10 torr (10 mm of Hg) or below. Preferably, the pressure is maintained between about 4 and about 10 torr.

Both the temperature of the substrate plates 28 and 30 and the intensity of the plasma within the reaction tube 20, particularly within the region between the plates 28 and 30, is maintained by the microwave energy provided by the microwave energy source 14. Sufficient energy is supplied by the source 14 to maintain the plasma and to establish a uniform temperature therein of about 900° C. to about 1050° C. Preferably, the uniformity created by the overall arrangement is such that the temperature across the entire surface area of the facing plates is at least about 925° C. and does not exceed about 975° C. It is believed that maintenance of this uniformity of temperature in such a plasma region of this character efficiently and economically effects the deposition of diamond across the entire surface areas of the plates 28 and 30.

Included inside of the reaction tube 20 is at least one substrate plate 28. In the preferred embodiment, a second substrate plate 30 is also included within the reaction tube 20 and is spaced apart from the first reaction tube 28. The substrate plates 28 and 30 are formed of a material which promotes the high temperature plasma deposition of diamond. Preferred materials include silicon, molybdenum or boron, either in elemental or compound form, preferably as nitride or carbide. Although these materials are preferred, other suitable materials such as those disclosed in U.S. Pat. No. 4,707,384, may alternatively be used. For example, each plate may be a solid bar or rail of silicon carbide or of elemental molybdenum; however, composite plate subassemblies may also be used. In such a composite, it is contemplated that a surface or face section constituting the plate 28 or 30 is carried by a backing section of relatively high thermal conductivity. The purpose of the backing section is not only to support the face section that serves as the substrate for the diamond deposition in the high temperature environment, but also to assure the effective spreading of the heat across the entire surface areas of the facing plates and, thus, minimize the creation of local hotspots and temperature gradients. As a result of this arrangement, the plates 28 and 30 are essentially thermally isolated from the remainder of the apparatus, and their temperature is closely controlled by radiative cooling.

Figure 2A:
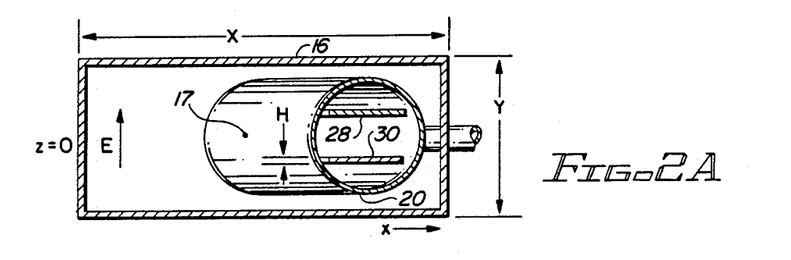
FIG. 2A is a sectional view of the element of FIG. 1A taken along the line 2A—2A.
Figure 2B:
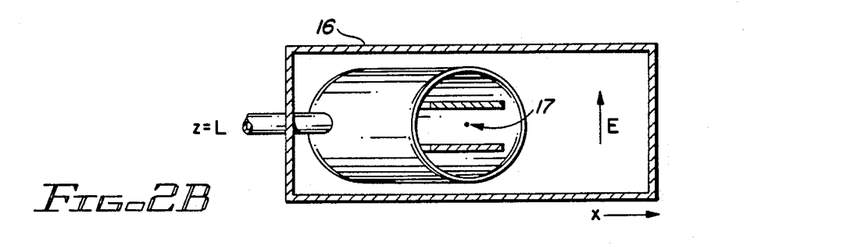
FIG. 2B is a sectional view of the element of FIG. 1A taken along the line 2B—2B.

The spaced-apart relationship of the two substrate plates 28 and 30 is further evident from the cross-sectional views of the device 12 shown in FIGS. 2A and 2B. These figures are also instructive to show that the surfaces of the substrate plates 28 and 30 are oriented to be perpendicular to a transverse electric field E present within the waveguide section 16 when such is energized with microwave energy from the source 14. This orientation places the smallest cross section of the substrate plates in line with the propagation direction of the microwave energy, thereby minimizing the effect such plates have on the microwave propagation and/or reflections.

As also is shown in FIGS. 1B, 2A and 2B, the reaction tube 20 is angled relative to the longitudinal axis 17 of the waveguide 16. (In the cross-sectional views of FIGS. 2A and 2B, this longitudinal axis lies in a plane perpendicular to the paper, hence it is shown as simply a dot.) FIG. 2A is a cross-sectional view of the waveguide 16 taken along the line 2A—2A of FIG. 1A. This is the location along the length of the waveguide section 16 closest to the microwave source 14 where the reaction tube 20, and more importantly the substrate plates 28 and 30 within the reaction tube, are first encountered (see FIGS. 1A and 1B). This point is identified in the figures, using the x-y-z coordinate system shown, as the point $z=0$, and this is also the point at which microwave energy from the microwave source 14 first encounters the start of the plasma column. (The "plasma column" is that region within the reaction tube 20, in the immediate region of the substrate plates, where the plasma is found to exist.) Similarly, FIG. 2B is a cross-sectional view of the waveguide 16 taken along the line 2B—2B of FIG. 1A. This is the location along the length of the waveguide section 16 farthest from the microwave source 14 where the reaction tube 20, and more importantly the substrate plates 28 and 30 within the reaction tube, terminate, and the plasma column also terminates. This point is identified as the point $z=L$. As is seen in FIG. 2A (and as is also evident from FIG. 1B), at the point $z=0$ the reaction tube 20 is positioned near, but not touching, one edge of the waveguide section 16. At the point $z=L$, as seen in FIG. 2B (and as also evident from FIG. 1B), the reaction tube 20 is positioned near the center of the waveguide section 16.

Figure 2C:
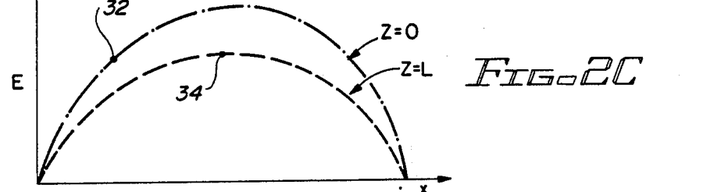
FIG. 2C is a graph illustrating the variation in the magnitude of the transverse electric field across the width of the element of FIG. 1A for a $TE_{10}$ mode of operation.

The importance of the orientation of the substrate plates 28 and 30 relative to the waveguide section 20 may be understood from reference to FIG. 2C, which shows a cross-sectional profile of the magnitude of the transverse electric field E for the two points $z=0$ and $z=L$ along the length of the waveguide section 16. At $z=0$, at the location nearest the microwave source 14, the electric field E is the strongest, although it varies from zero at the edges of the waveguide to a maximum peak in the center of the waveguide. As the distance from the source 14 increases, the magnitude of the field E decreases due to absorption of the microwave power in the plasma. Thus, at the point $z=L$, the magnitude of the field E still has a similarly shaped cross sectional profile (varying from zero at the edges to a maximum peak in the center), but the maximum peak at $z=L$ is less than the maximum peak at $z=0$ due to the natural attenuation of the microwave energy as that energy travels through the waveguide. In accordance with the teachings of the present invention, in order to promote a uniform plasma along the entire length of the substrate plates 28 and 30, it is desirable to position the substrate plates within the waveguide so that at all points along the length of the substrate plates, the magnitude of the transverse electric field E is approximately the same, or if not the same, at least within an allowable range. Hence, at the point $z=0$, where the field E is the strongest, the substrate plates are positioned at a point 32 in the cross-sectional profile where the field strength is somewhere between its peak value and zero. At the point $z=L$, where the field E is weakest, the substrate plates are positioned at a point 34 in the cross-sectional profile where the field strength is at or near its peak value. Advantageously, the magnitude of the electric field E at the point 32 is approximately the same as the magnitude of the electric field E at the point 34. Further, assuming the substrate plates and reaction tube follow more or less a straight line between the points 32 and 34, it can be shown that for all points along this straight line between $z=0$ and $z=L$, the magnitude of the electric field E will not change significantly (i.e., will be within an allowable range) from that existing at the points 32 and 34. Hence, the electric field E present at the substrate plates and the plasma column over the entire length from $z=0$ to $z=L$ remains within an acceptable range. This path or line of a more or less constant transverse electric field between the beginning point 32 and the end point 34 is referred to herein as a constant electric field contour line. It is desirable that the substrate plates (and hence the reaction tube and the plasma column within the reaction tube) be positioned within the waveguide 16 so that the center of each substrate plate closely follows a substantially constant electric field contour line through the waveguide.

As is known to those skilled in microwave transmission art, the transverse electric field profiles illustrated in FIG. 2C correspond to a particular waveguide mode of operation for waveguide transmission of microwave energy. In general, the mode of transmission may be described as $TE_{mn}$ and $TM_{mn}$, where TE indicates that the electric field is everywhere transverse to the axis of the transmission line (waveguide), and TM indicates that the magnetic field is everywhere transverse to the axis of the transmission line. The subscript m, for rectangular waveguides, denotes the number of maxima of electric field (or magnetic field) along the wide dimension (the x-direction in FIGS. 2A–2C) of the waveguide. The subscript n denotes the number of maxima of electric field (or magnetic field) along the narrow (the y-direction in FIGS. 2A–2C) of the waveguide. Thus, the waveguide mode illustrated in FIG. 2C, and the positioning of the reaction tube 20 shown in FIGS. 2A and 2B, correspond to a waveguide mode of $TE_{10}$. As will be explained below, other waveguide transmission modes are possible. Further, other types of waveguides, in addition to rectangular waveguides, could also be employed. The primary concern is that the substrate plates be positioned within the waveguide so as to closely follow an electric field contour line of approximately constant value. For example, if a circular waveguide were employed, operating in a waveguide transmission mode where the electric field varies in a given cross section as a function of its radial position, a substrate plate substantially in the shape of a cylinder (or half cylinder), having a radius that decreases slightly as its distance from the microwave source increases, could be fashioned to follow an approximately constant electric field contour line within the waveguide.

Advantageously, the present invention solves the problem of a non-uniform plasma due to: (1) absorption depth of the microwave radiation in the plasma, and (2) standing wave patterns. The absorption depth of the microwave radiation is improved by utilizing a proper geometry of the reaction tube diameter and the width of the substrate plate. Preferably, the diameter of the reaction tube 20 and the width of the substrate plate should be at most on the order of twice the absorption depth. The absorption depth is the depth that the microwave energy penetrates into the plasma before reflection occurs. Such reflection is caused because the density of the plasma increases as the energy penetrates into the plasma from each side of the plasma column. The maximum penetration depth that can be achieved is a function of the frequency of the microwave radiation. Foe example, at 2.45 GHz, a typical penetration depth for the incident angles of microwave energy that are used may be on the order of 1 cm. Hence, at 2.45 GHz, and assuming penetration of the microwave energy from both sides of the plasma column, a substrate plate width of around 2 cm assures that the plasma column covering such a substrate plate will be penetrated all the way through. Further, the relatively small angle of the reaction tube to the waveguide axis, which is typically only on the order of a few degrees, e.g., five degrees, prevents significant backward reflection of the microwave radiation from the plasma or the substrate. Moreover, standing waves are avoided by the waveguide geometry. Radiation leaving the waveguide section 16 is largely absorbed by the matched-load termination 18. The length of the reaction tube, L, which is the characteristic scale length of the perturbation seen by the traveling wave, is preferably larger than the waveguide wavelength, so as to further keep the reflected power small. Moreover, any viewports or penetrations of the waveguide, as are commonly used in such devices, are kept small to avoid additional reflected power.

The microwave source 14 may be a conventional magnetron operating at a selected frequency, e.g., 2.45 GHz. At this frequency, it is preferred that the transverse electric field E have an absolute value on the order of 100 V/cm in order to properly sustain the plasma column within the reaction tube. As is known in the art, a tesla coil may be used to aid in the plasma start-up, if needed.

As seen in FIG. 1B, the reaction tube 20 is supplied at one end with a gaseous mixture from a suitable source 24 and pumped from the other end with a pump 26 so as to maintain a continuous flow of gas through the tube. The gas flow rate is in the range of 100 sccm to 10,000 sccm, where sccm is standard cubic centimeters per minute.

Figures 3, 4A:
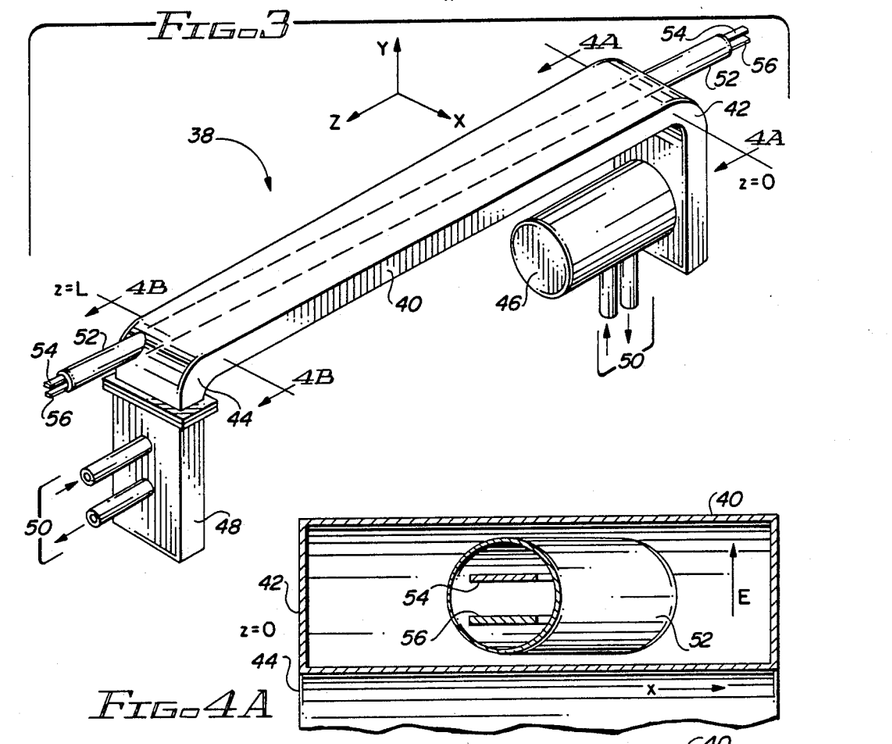
FIG. 3 is an isometric view of a preferred embodiment of a diamond production element in accordance with the present invention.
FIG. 4A is a sectional view of the element of FIG. 3 taken at the point where $z=0$.
Figure 4B:
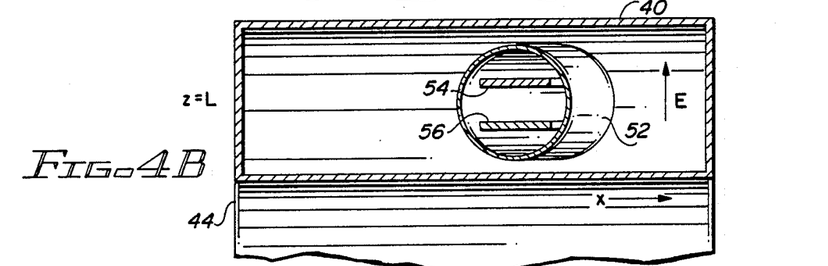
FIG. 4B is a sectional view of the element of FIG. 3 taken at the point where $z=L$.

Referring next to FIGS. 3 and 4A–4C, a preferred embodiment of a diamond production element 38 of the present invention is illustrated. FIG. 3 is an isometric view of this embodiment, while FIGS. 4A and 4B are cross-sectional views taken at the points $z=0$ and $z=L$, respectively. In this embodiment, the points $z=0$ and $z=L$ are at approximately the ends of the effective uniform deposition region. This embodiment includes a waveguide section 40 having a first elbow 42 at one end thereof, and a second elbow 44 at the other end thereof. A suitable microwave source 46, such as a magnetron, is coupled to the first elbow 42, and a matched termination load 48 is coupled to the second elbow 44. As required, a suitable cooling liquid may be pumped through the matched load 48 and the microwave source 46 through tubing 50. A reaction tube 52, having a pair of spaced apart substrate plates 54 and 56 therein, passes through the waveguide section 40 and protrudes out of each elbow 42, 44. A gaseous mixture is pumped through this reaction tube from a suitable gas source using a pump, similar to the manner shown in FIG. 2B. A plasma column is set up within the reaction tube, using a tesla coil if needed, as is known in the art. Once this plasma column is set up, it is maintained with the energy from the traveling microwaves that are passed through the waveguide section 40 from the source 46 to the matched load 48.

Figures 4C, 8:
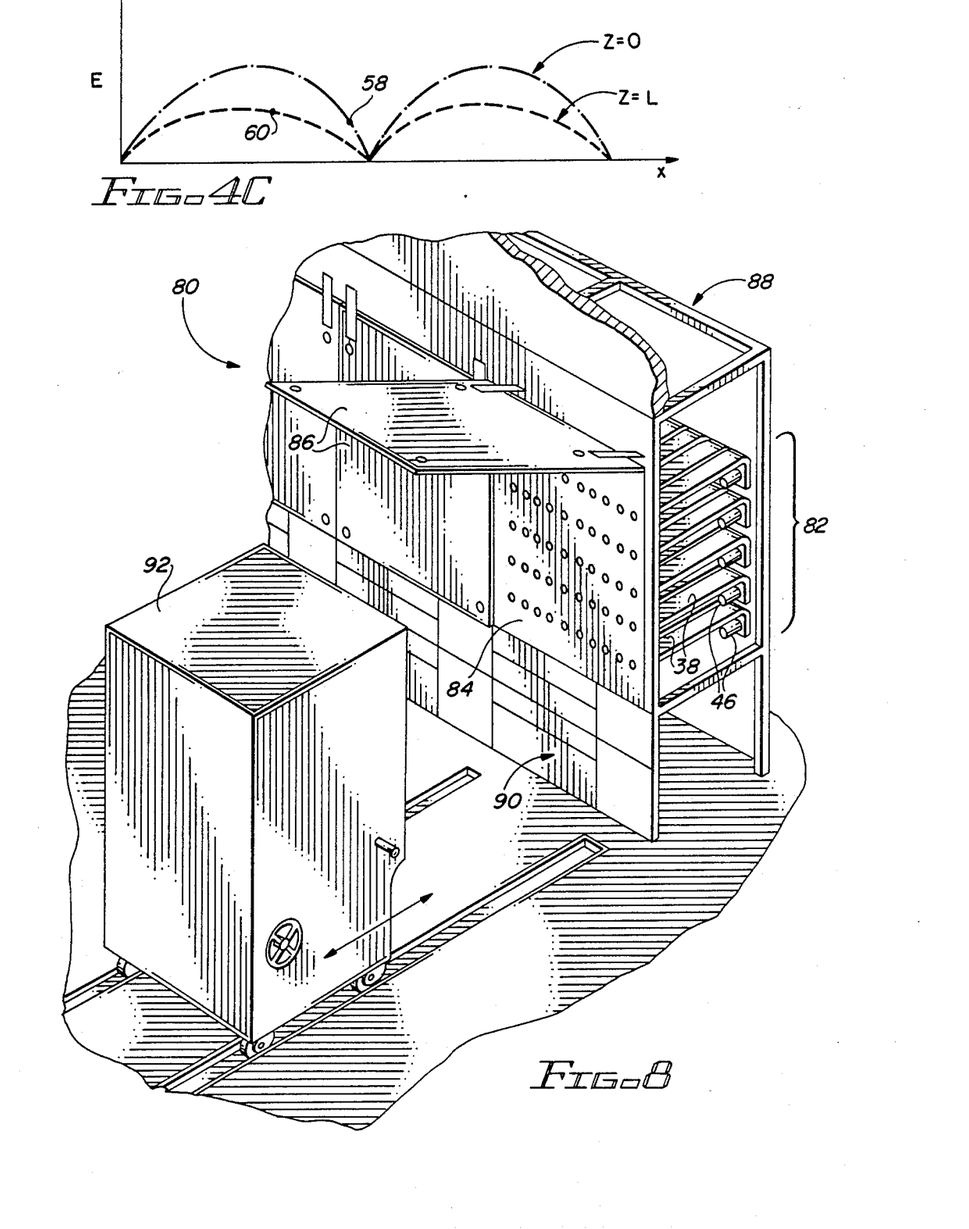
FIG. 4C is a graph illustrating the variation in the magnitude of the transverse electric field across with width of the waveguide device of FIG. 3 for a $TE_{20}$ mode of operation.
FIG. 8 illustrates a production device wherein several of the production elements of FIG. 3 are grouped together and share a common gas feed and pump.

The embodiment shown in FIG. 3 operates in the $TE_{20}$ transmission mode. Hence, there are two peaks associated with the transverse electric field for any given cross section of the waveguide, as well as a null in the center of this cross section. FIG. 4C illustrates the profile of the electric field for this mode at the points $z=0$ and $z=L$. The reaction tube 52, and the substrate plates 54 and 56, are positioned near the center of the waveguide at $z=0$ where the microwave traveling wave first encounters the reaction tube (and the plasma column therein). The magnitude of the electric field E at this point is intermediate its peak value and its minimum value, such as is illustrated at point 58 in FIG. 4C. A significant advantage of the $TE_{20}$ mode is that the reaction tube can be placed arbitrarily close to the interior null and need not be positioned near the edge or wall of the waveguide, as is required when operating in the $TE_{10}$ mode (see FIG. 2C). It is noted that if the reaction tube touches the waveguide edge, then an adverse heat flow may occur between the reaction tube and the waveguide, thereby making it more difficult to maintain a uniform plasma.

At the point along the waveguide section 40 where $z=L$, the reaction tube is positioned so that it is generally at a location where the electric field E is at or near a maximum, such as at point 60 in FIG. 4C. At all points between $z=0$ and $z=L$, the electric field E has a magnitude that remains approximately the same as the values at points 58 and 60 (or is at least within an allowable range of these values). Said another way, the reaction tube is angled relative to a longitudinal axis of the waveguide section 40 so as to approximately follow a constant electric field contour line between the points $z=0$ and $z=L$.

A significant advantage of the embodiment shown in FIG. 3 is that it allows convenient access to the substrate plates 54 and 56 within the reaction tube. That is, by making at least one end of the reaction tube 52 detachable, or otherwise removable or openable during a plate loading/unloading operation, the substrate plates 54 and 56 can be easily removed and inserted, as required, in order to collect diamond that has been deposited.

Another advantage of the embodiment shown in FIG. 3 is that it promotes efficient use of the available space. That is, the overall length of the element need not be much in excess of the length of the plasma column. With this configuration, the microwave source 46 and the matched load 48 are conveniently tucked underneath the waveguide section 40.

It is preferred that the gas flow through the reaction tube 52 be such as to impinge on the surface of the substrate plates rather than flowing parallel to them. One approach for achieving this is to employ a large flow velocity generating a degree of turbulence to break up a laminar flow. For a 2 cm diameter reaction tube, a gas flow of greater than 300 sccm should be used.

Figures 5, 7:
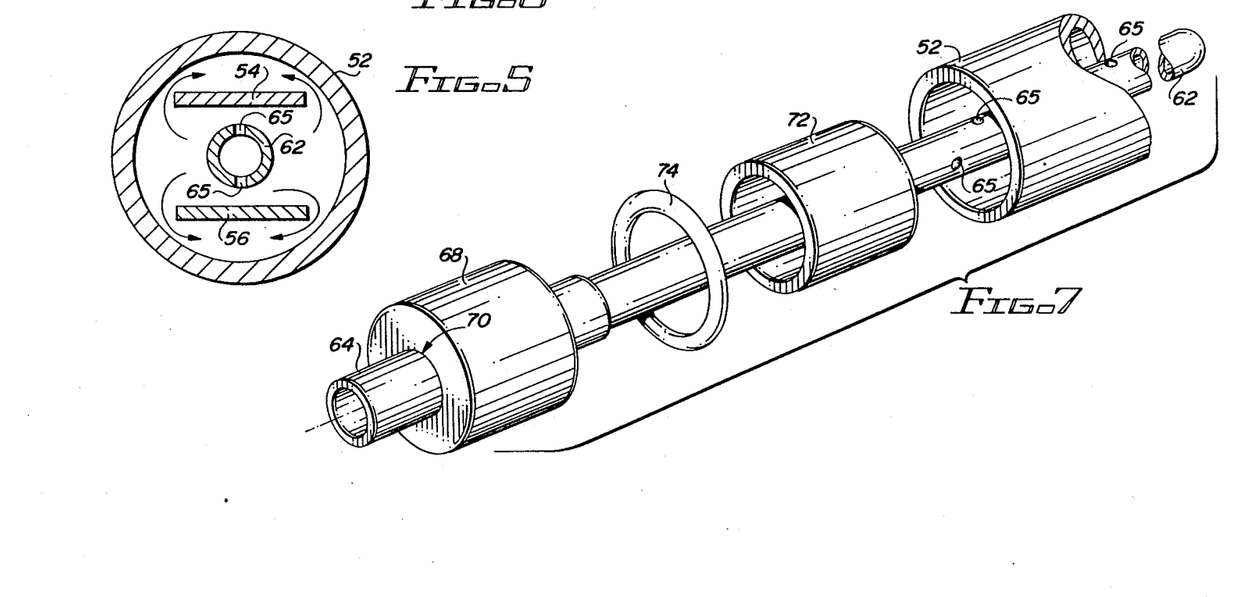
FIG. 5 is an end sectional view of one embodiment of a reaction tube used in the production element of FIG. 3.
FIG. 7 is an exploded view of an end portion of the reaction tube of FIG. 5, illustrating the manner in which a gas feed tube detachably connects with the reaction tube.
Figure 6:
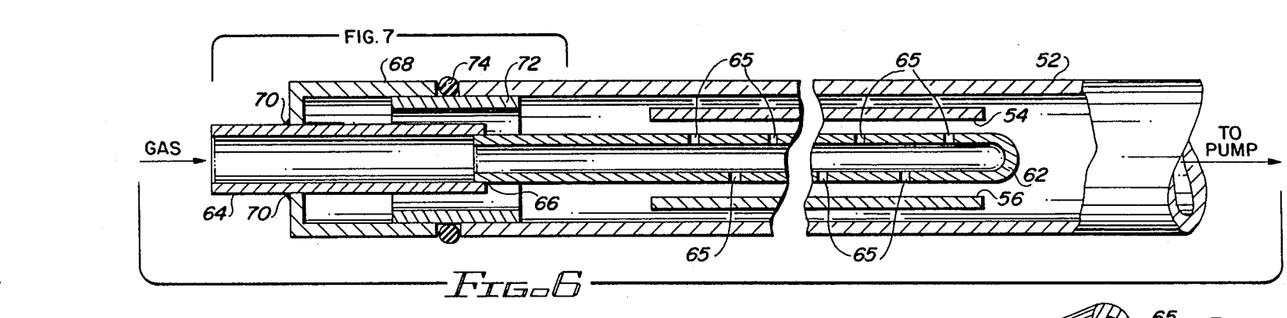
FIG. 6 is a side sectional view of the reaction tube of FIG. 5.

Another approach to preventing a laminar flow is to use a gas dispenser tube 62 as shown in FIGS. 5 and 6. FIG. 5 is an end cross-sectional view of the reaction tube 52, and FIG. 6 is a side cross-sectional view. The gas dispenser tube 62 is mounted concentric with the reaction tube 52, but is of a much smaller diameter, so as to allow it to fit between the substrate plates 54 and 56. For a 2 cm diameter reaction tube, having a length of 110–120 cm, the gas dispenser tube 62 may have an inner diameter on the order of 3 mm and may be on the order of 100 cm long. Such a dispenser tube has a plurality of apertures 65 that are 0.2 mm in diameter and spaced 3 cm apart in two rows, one directly opposite each of the substrate plates.

Use of the gas dispenser tube 62 (or other suitable approaches for breaking up the laminar flow of gas through the reaction tube) further promotes the flow of the gaseous mixture throughout the entire reaction tube, both in the region between the plates 54 and 56, and also in the region behind the plates 54 and 56, as shown best in FIG. 5. By ensuring that both sides of the plates 54 and 56 are exposed to the gas, diamonds can be deposited on both sides of the plates, thereby significantly increasing the surface area on which diamond may be deposited. Further, as seen best in FIG. 5, the width of the plates 54 and 56 may be such as to almost touch the inner walls of the tube 52. In fact, if the plates 54 and 56 do touch the inner wall edges of the tube 52, but do not create a seal that prevents the gaseous mixture from flowing in all regions of the reaction tube, a convenient way for accurately measuring the temperature of the plates is provided. This is because temperature measurements are typically made using an optical pyrometer, and having an edge of the plate optically accessible to the pyrometer without having to look through the gaseous mixture enhances the accuracy of the temperature measurement.

In order for the requisite pressures associated with the diamond deposition process of the present invention to be maintained, the reaction tube 52 must be tightly sealed. However, in order for the substrate plates 54 and 56 to be accessible, some means must be employed to conveniently break the seal during a loading/unloading operation. One manner of accomplishing such a breakable vacuum seal is further illustrated in FIGS. 6 and 7. FIG. 6 is a cross-sectional view of the reaction tube 52 and the dispenser tube 62, as described above. FIG. 7 is an exploded view of the vacuum seal end of the tube 52. The gas dispenser tube 62 is made of alumina and is fused to a gas inlet pyrex tube 64 for a tight vacuum seal 66 (FIG. 6). The gas flow is preferably about 1000 sccm. A pyrex cap 68 is bonded and tightly sealed to the pyrex tube 64 to form a seal. The pyrex cap 68 is of the same size as the reaction tube 52, which is preferably made from quartz. A quartz collar 72 is tightly bonded and sealed to the quartz reaction tube 52. This quartz collar 72 has an outside diameter that forms an interference fit with the inside diameter of the pyrex cap 68. An 0-ring 74 is placed over the collar 72. This 0-ring forms a tight seal between the cap 68 and the end of the reaction tube 52 when the gas inlet assembly, comprising the gas inlet tube 64 and gas discharge tube 62, is slidably inserted into the reaction tube 52. The O-ring 74 is preferably made from a suitable high temperature elastomer.

Referring next to FIG. 8, a traveling-wave microwave diamond production apparatus 80 is illustrated in perspective view. This apparatus includes a plurality of the production elements 38 of the type previously described. Preferably, a large number, e.g., 50, of such elements 38 are mounted in an array 82 such that all the reaction tubes, and substrate plates, are substantially parallel to each other. Moreover, one end of each reaction tube opens to a panel area 84. This panel 84 lies in a plane that is substantially perpendicular to the longitudinal axis of each reaction tube. As illustrated in FIG. 8, a production unit 88 of fifty of such reaction tubes, arranged in five rows of ten tubes each, are open to the panel area 84. A hinged door 86 makes a tight seal with each of these open tubes. When open, the substrate plates of all fifty reaction tubes are conveniently accessible through the panel area 84. When closed, the array 82 of all fifty of the units is sealed, and the diamond production process may be carried out simultaneously in all fifty reaction tubes.

Advantageously, all of the production elements in the array 82 share a common gas feed and pumping system, essentially operating in parallel. Conventional equipment used to perform this pumping and feed function, and the other support functions, may be conveniently located underneath the array 82 in an equipment portion 90 of the apparatus 88, or elsewhere. The gaseous mixture that is pumped through each reaction tube is preferably recirculated with replacement of the carbon or hydrocarbon used in the diamond deposition. All of the microwave sources 46 of each reaction tube may share a common power supply. Moreover, the cooling systems used in connection with the matched load terminations and the magnetron microwave sources may also share a common pump and heat exchanger. Thus, all of the controls and support systems used with a single production element 38 may be shared in common with all of the elements 38 within the array 82, thereby simplifying the construction and operation of the system.

As illustrated in FIG. 8, additional production units, of fifty reaction tubes each, may be positioned adjacent the unit 88 as desired, thereby making the production apparatus 80 as large as desired. To facilitate the insertion and removal of the substrate plates within each reaction tube, a portable loading device 92 may be used. Such a device includes, for example, fifty loading mechanisms, such as mechanical fingers, designed to operate in parallel to simultaneously retrieve the substrate plates from each reaction tube. Power for the loading device 92 may be either manual (turning a crank that is coupled through a suitable gearing network to the loading mechanisms), electrical, or hydraulic. The same or a similar mechanism could be used to simultaneously insert all fifty substrate plates back into the reaction tubes of each element 38 once the diamond has been removed therefrom.

EXAMPLE

A substrate made from molybdenum, approximately 2 cm wide, 1 mm thick, and from 30 to 100 cm long, is inserted inside a quartz tube. The tube is positioned within a 2.45 GHz rectangular waveguide. A matched termination load is fastened to one end of the waveguide. A conventional magnetron, designed for operation at 2.45 GHz, is coupled to the other end of the waveguide. The tube is positioned close to the inside corner at the source end of the waveguide and is angled to move towards the center bottom of the waveguide at the end away from the source. A gaseous mixture, comprising roughly 90% hydrogen, 5% methane, and 5% carbon dioxide is pumped through the gas tube at a pressure of 4-6 torr and a flow rate of about 600 sccm. The waveguide is excited with microwave energy at 2.45 GHz from the magnetron, and this microwave energy propagates through the waveguide in the $TE_{10}$ mode. The power delivered by the magnetron is adjusted to approximately 5 watts/cm$^2$ of substrate area. If this power level is insufficient to initiate plasma formation, the power level is increased momentary 20-30%. Alternatively, the formation of plasma may be enhanced by placing the tip of a tesla coil to one end of the tube while microwave power is being delivered to the waveguide. Once the plasma is formed, the microwave power is maintained at about the 5 watts/cm$^2$ level for several hours. During this time, the temperature at the substrate surface is maintained (by controlling the power level) between 900° and 1050° C., as checked using an optical pyrometer. After about 1 hour, the formation of diamond crystals on the substrate is observed. The growth rate (increase in diameter) of these diamond crystals at the conditions specified is approximately 6 microns per hour. After about 3 hours, the formation of diamond film on the substrate is observed. The growth rate (increase in thickness) of this diamond film at the conditions specified is on the order of 1 micron per hour.

While the invention described herein has been described with reference to particular embodiments and applications thereof, numerous variations and modifications could be made thereto by those skilled in the art without departing from the spirit and scope of the invention.

What is claimed is:

1. Apparatus for depositing diamond comprising:
   a waveguide structure, said waveguide structure including an elongate waveguide section having a first end, a second end, and a length therebetween, and defining a substantially internal uniform cross section at all points along the length of the section;
   a reaction tube disposed within said waveguide section;
   at least one substrate plate disposed within said tube and extending substantially in the longitudinal direction thereof;
   means for maintaining a gaseous mixture within said tube at a prescribed pressure, said gaseous mixture having a composition that promotes the deposition of diamond on said at least one substrate when exposed to said microwave energy;
   means for applying microwave energy at the first end of said waveguide section for causing a traveling wave of microwave energy to pass lengthwise through said waveguide section to create plasma in said gaseous mixture, heating said gaseous mixture and said at least one substrate, said traveling wave being propagated in a $TE_{mn}$ mode wherein the transverse electric field thereof has a magnitude that varies within a given cross section of the waveguide section from zero at the waveguide structure to at least one maxima within said cross section, and wherein said at least one maximum decreases in amplitude with distance from the first end of the waveguide section; and said reaction tube extending generally in the longitudinal direction of said waveguide section but obliquely thereof with the interior of said tube in a region of substantially constant power absorption through said waveguide section.

2. Apparatus according to claim 1 wherein said reaction tube is disposed in a region of substantially constant transverse electric field strength through said waveguide section.

3. Apparatus according to claim 2 wherein said reaction tube is substantially straight and of uniform cross section with its longitudinal axis disposed obliquely of the axis of said waveguide section.

4. Apparatus according to claim 2 wherein said at least one substrate is positioned within the reaction tube with a surface thereof following substantially along a contour of substantially constant magnitude of the transverse electric field.

5. Apparatus according to claim 1 wherein said reaction tube contains a pair of facing substrate plates having front surfaces spaced apart from each other, and rear surfaces facing away from each other, and wherein said reaction tube further includes means for directing said gaseous mixture between said front surfaces, whereby the deposition of said diamond is promoted over at least the front surfaces of said pair of substrate plates.

6. Apparatus according to claim 5 wherein said reaction tube further includes means for impinging the gaseous mixture against the front surfaces of said pair of substrate plates along the entire length of said plates.

7. Apparatus according to claim 6 wherein said means for impinging the gaseous mixture against the front surfaces of said pair of substrate plates comprises means for directing the gaseous mixture within said reaction tube at a velocity greater than 300 standard cubic centimeters per minute, whereby a turbulence is set up within the gas flow that causes the gaseous mixture to impinge upon the front surfaces of said substrate plates.

8. Apparatus according to claim 6 wherein said means for impinging the gaseous mixture against the front surfaces of said pair of substrate plates comprises a gas supply tube placed inside of said reaction tube, said gas supply tube having spaced apart apertures thereon that direct the gaseous mixture towards the front surfaces of said pair of spaced apart substrate plates.

9. Apparatus according to claim 6 wherein said pair of substrate plates are further positioned within said reaction tube so as to allow said gaseous mixture to flow around each substrate plate in the region of its respective rear surface, whereby the deposition of said diamond is promoted on both the front and rear surfaces of each of the substrate plates of said pair of substrate plates.

10. Apparatus according to claim 1 wherein said waveguide structure further includes a matched load termination device coupled to the second end of said waveguide section for minimizing microwave reflections at the second end.

11. Apparatus according to claim 10 wherein the number of maxima in the magnitude of the transverse electric field within the cross section of said waveguide section is one, said maximum being located at the center of the cross section, said traveling wave being propagated in the $TE_{10}$ transmission mode.

12. Apparatus according to claim 11 wherein said at least one substrate is positioned within said waveguide section to lie near the edge of the cross section at the first end of the waveguide section, at a first location where the magnitude of the transverse electric field is less than its maximum and at the second end of the waveguide section to lie at a second location where the magnitude of the transverse electric field is approximately the same as at said first location.

13. Apparatus according to claim 10 wherein the number of maxima in the magnitude of the transverse electric field within the cross section of said waveguide section is two, said maxima being positioned approximately $\frac{1}{4}$ of the distance across the cross section from each edge, said traveling wave being propagated in the $TE_{20}$ mode.

14. Apparatus according to claim 13 wherein said at least one substrate is positioned within said waveguide section to lie away from the edge of the cross section at the first end of the waveguide section at a first location where the magnitude of the transverse electric field is less than a maximum, and at the second end of the waveguide section to lie at a second location of the cross section where the magnitude of the transverse electric field is approximately the same as at said first location.

15. Apparatus according to claim 1 wherein said waveguide structure includes a body portion having a longitudinal axis, and a first elbow portion at one end of said body portion, and further wherein said reaction tube is positioned within said body portion so as to have one end thereof protrude from the first elbow portion, said protruding end having access means therein for allowing access into the tubular body of said reaction tube for the purpose of removably inserting said at least one substrate, whereby diamond deposited on said at least one substrate can be recovered.

16. Apparatus according to claim 15 wherein said first elbow portion includes a matched load termination device connected thereto for minimizing microwave reflections within said waveguide structure.

17. Apparatus according to claim 16 further including a second elbow portion connected to the other end of said body portion, said second elbow portion being connected to said means for applying microwave energy.

18. Apparatus for producing diamond using a chemical deposition process, said apparatus comprising:
    a plurality of diamond production elements, each of said production elements including:
        a waveguide structure, said waveguide structure including an elongate waveguide section having a first end, a second end, and a length therebetween, and defining a substantially uniform internal cross section at all points along the length of the section,
        a reaction tube disposed within said waveguide section,
        at least one substrate disposed within said tube and extending substantially in the longitudinal direction thereof;
        means for maintaining a gaseous mixture in said tube at a prescribed pressure, said gaseous mixture having a composition that promotes the deposition of diamond over said at least one substrate when exposed to said microwave energy;
        access means located at one end of said tube for allowing said at least one substrate to be removably inserted into said tube;
        means for applying microwave energy at the first end of said waveguide section in accordance with a prescribed microwave transmission mode, said microwave energy passing lengthwise through said waveguide section as a traveling wave, said transmission mode causing a transverse electric field to be set up within said waveguide section, and said reaction tube extending generally in the longitudinal direction of said waveguide section but obliquely thereof with the interior of said tube in a region of substantially constant power absorption through said waveguide section; mounting means for mounting said plurality of diamond production elements in an array that positions all of the reaction tubes of respective production elements substantially parallel to each other, and that further positions the end of each production element having said access means substantially in a plane that is perpendicular to the longitudinal direction of each reaction tube, whereby removable access to all the substrates may be obtained through access to said plane; and means coupled to said mounting structure for delivering said gaseous mixture to all of said production elements at the specified pressure from a single source of said gaseous mixture.

19. Apparatus according to claim 18 wherein said at least one substrate is disposed within the reaction tube at locations within the cross section of the waveguide section whereat the magnitude of the transverse electric field is approximately the same through said waveguide section according to the prescribed transmission mode.

20. Diamond production apparatus comprising:

waveguide means through which microwave energy may be transmitted according to a prescribed mode of transmission;

a substrate within said waveguide means positioned to lie approximately along a constant electric field contour line of said waveguide means when said waveguide means is operated in said prescribed mode of transmission;

supply means for supplying a gaseous mixture at a specified pressure to that portion of the waveguide means proximate said substrate, said gaseous mixture having a composition that promotes the deposit of diamond on said substrate when said gaseous mixture is maintained at approximately said specified pressure and when said gaseous mixture and said substrate are elevated to a prescribed temperature range; and means for generating a microwave plasma in said gaseous mixture proximate said substrate, said microwave plasma generating means including means for energizing said waveguide means with microwave energy that travels through said waveguide means according to said prescribed mode of transmission, said microwave energy ionizing said gaseous mixture as it travels through said waveguide, thereby creating said plasma, and said traveling microwave energy further heating said gaseous mixture and said substrate to the prescribed temperature, whereby diamond is deposited on the surface of said plate.

21. Apparatus according to claim 20 further including a reaction tube wherein said substrate is disposed, and further wherein said reaction tube is positioned within said waveguide means to approximately parallel a constant electric field contour line of said waveguide means for said prescribed transmission mode, said gaseous mixture being supplied from said supply means to said reaction tube.

22. Apparatus according to claim 20 wherein said supply means impinges said gaseous mixture on said substrate at a plurality of locations along the length thereof.

* * * * *